(12) United States Patent
Lin (10) Patent No.: US 9,904,171 B2
(45) Date of Patent: Feb. 27, 2018

(54) RESIST PATTERN HARDENING MATERIAL AND METHOD OF FABRICATING THE SAME

(71) Applicant: I-Shan Ke, New Taipei (TW)

(72) Inventor: Yu-Hsun Lin, Taichung (TW)

(73) Assignee: I-Shan Ke, New Taipei (TW)

( * ) Notice: Subject to any disclaimer, the term of this patent is extended or adjusted under 35 U.S.C. 154(b) by 5 days.

(21) Appl. No.: 15/007,173

(22) Filed: Jan. 26, 2016

(65) Prior Publication Data

US 2016/0342091 A1 Nov. 24, 2016

Related U.S. Application Data

(60) Provisional application No. 62/165,219, filed on May 22, 2015.

(51) Int. Cl.
| | |
|---|---|
| *G03F 7/32* | (2006.01) |
| *G03F 7/16* | (2006.01) |
| *G03F 7/20* | (2006.01) |
| *G03F 7/38* | (2006.01) |
| *G03F 7/039* | (2006.01) |
| *G03F 7/038* | (2006.01) |

(52) U.S. Cl.
CPC .............. *G03F 7/327* (2013.01); *G03F 7/038* (2013.01); *G03F 7/039* (2013.01); *G03F 7/168* (2013.01); *G03F 7/2004* (2013.01); *G03F 7/2059* (2013.01); *G03F 7/38* (2013.01)

(58) Field of Classification Search
CPC ........................................................ G03F 7/32
See application file for complete search history.

(56) References Cited

U.S. PATENT DOCUMENTS

| | | | |
|---|---|---|---|
| 2007/0172761 A1 | 7/2007 | Takahashi et al. | |
| 2013/0273330 A1* | 10/2013 | Wang | B81C 1/0038 428/172 |
| 2014/0217395 A1* | 8/2014 | Facchetti | H01L 29/7869 257/43 |
| 2014/0234785 A1* | 8/2014 | Hatakeyama | G03F 7/40 430/326 |
| 2016/0154312 A1* | 6/2016 | Hatakeyama | G03F 7/325 430/296 |

* cited by examiner

*Primary Examiner* — Kathleen Duda
(74) *Attorney, Agent, or Firm* — CKC & Partners Co., Ltd.

(57) ABSTRACT

A positive tone photoresist etching development agent for a photoresist film containing acid liable groups includes 0.5 to 2% by weight of tetramethylammonium hydroxide (TMAH), 1 to 20% by weight of an additive having at least two polar functional groups and at least one solvent. The additive has a molecular weight higher than 40, the solvent is water or alcohol, and the agent treated photoresist film retains at least 20% of acid liable groups.

1 Claim, 6 Drawing Sheets

Fig. 6

RESIST PATTERN HARDENING MATERIAL AND METHOD OF FABRICATING THE SAME

RELATED APPLICATIONS

This application claims priority to U.S. provisional No. 62/165,219, filed May 22, 2015, which is herein incorporated by reference.

BACKGROUND

Field of Invention

The present invention relates to a developer. More particularly, the present invention relates to a developer in photo resist process.

Description of Related Art

In lithography, organic photoresist layer first coats on a substrate and then is exposed to suitable exposure tool. After or during exposure, the photoresist layer may be heated or without heated to undergo a chemical reaction that transfers the polarity of the photoresist layer by a developer. In positive tone developer, polymer having higher polarity dissolves and is washed away. The remaining polymer converts to the photoresist pattern. In negative tone developer, the developer is hydrophobic liquid. The hydrophobic part of the polymer dissolves and is washed away. The remaining pattern on the substrate is hydrophilic/exposed photoresist pattern.

Conventionally, the positive tone developer is a liquid (water) base developer. It may compose of base ingredient to enhance the polymer solubility. The base ingredient may be selected from TMAH, TBAH, KOH, NaOH, or the like. The concentration may vary from 0.05% to 5% and the pH value is higher than 11. The base developer may compose of surfactant for surface tension control.

For negative tone developer, solvent is the key ingredient. It may be NMP, GBL, NBA, MIBC, PGME, PGMEA, cyclohexanone, cyclopentanone, Iso-amyl-acetate(IAA), Pentyl acetate, isobutyl propionate, sec-butyl propionate, isopropyl isobutyrate, ethyl pivalate, 5-Methyoxy 3-Hexanone, methyl-2methyl pentanoate, ethyl 2-methyl butanoate, or the like.

For exposure process, the exposure source may be KrF, ArF, immersion ArF, EUV, or E-beam.

Figure 1A:
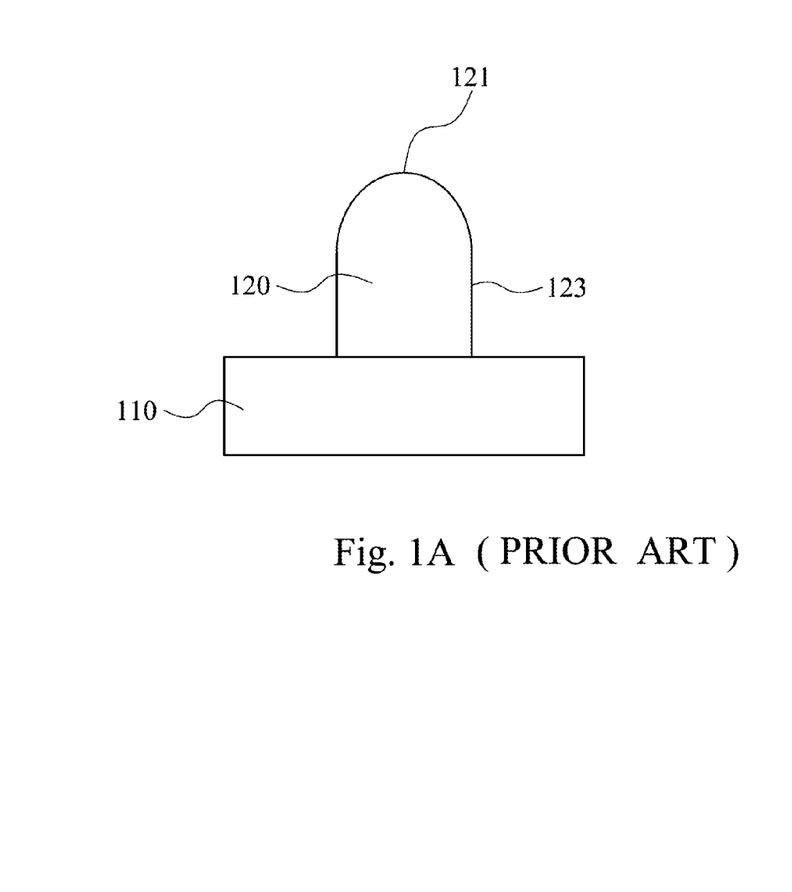
FIGS. 1A-1B are schematic diagrams showing substrate profile after conventional etching development.
Figure 1B:
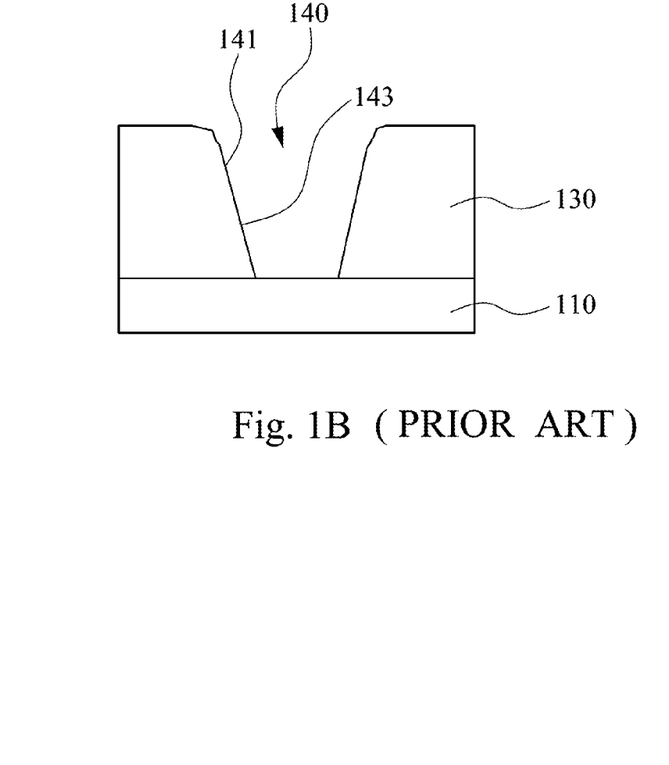

Please refer to FIGS. 1A and 1B. In conventional positive or negative developing process, the thickness of the photoresist layer after development is lower than its original thickness. The reason is that the non-exposed area of the photoresist layer and partially exposed photoresist layer show different dissociation rate to the positive developer. As shown in FIG. 1A line or island pattern 120, rounded corners are observed at the tip region 121 while the bottom portion 123 retains its integrity. Similarly, in FIG. 1B trench or hole pattern 140, rounded corners and taper profile are observed at 141 and 143 respectively. In negative tone developing process, the exposed area still shows a dissociation rate to the developer. In other words, the developer is too strong to avoid damaging supposedly protected area. Therefore, the effective photoresist layer thickness is compromised and cannot offer sufficient shielding effect during etching or implanting.

Another concern is the photoresist layer profile may change. In an ideal case, a square photoresist layer profile is preferred. If the loss of photoresist layer is to a greater extent, the photoresist layer profile becomes rounded or tapered as shown in FIGS. 1A and 1B. This rounded profile results from weakened etching resistance. The etching rate is higher at the corner rounding or an initial contact area, and photoresist material at this region is consumed more than square profile during etching. The desirable pattern will be altered since the effective thickness of the photoresist and photoresist profile is changed.

Figure 2:
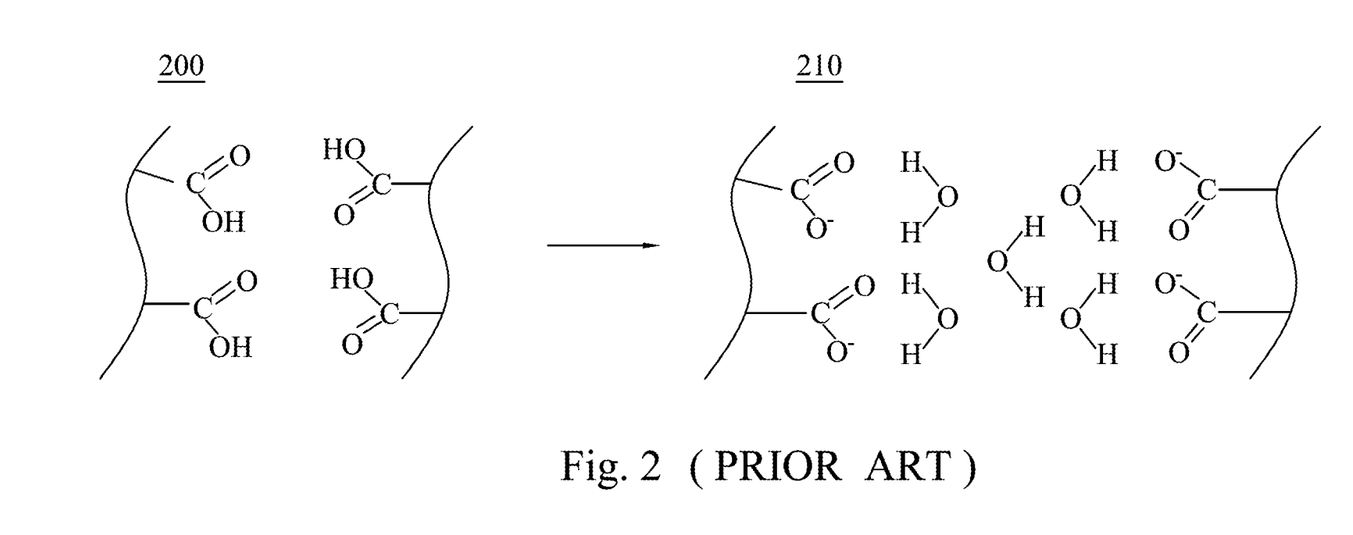
FIG. 2 is a schematic diagram showing carboxyl group dissociating.

Photoresist is designed to have polarity switch before exposure and after exposure/baking. Please refer to FIG. 2 in conjunction with FIG. 3. The acid labile group (ALG) 310 is the key component for polarity switch. Typically, in KrF material, ALG 310 can be t-BOC protected polyhydrostyrene. In ArF, EUV, and E-beam material, ALG 310 can be, for example, methyl adamantly (MAdMA), ethyl adamantly (EAdMA), or Propyl Adamantyl (PAdMA). For the non-ALG portion 320, in ArF photoresist, the non-ALG moiety 320 can be cyclic, double cyclic, or multi-ring lactone. The structure and property of multi-ring lactone is disclosed in the US patent publication No. 20070172761 A1. Lactone will be more polar when encountering alkaline solution. As shown in FIG. 2, when the ALG portion 310 is leaving, the polymer become hydrophilic and soluble with water during developing. It increases the polymer dissolution rate and the soluble polymer leaves from the resist film layer when the dissolution rate is high enough. As also shown in FIG. 2, the lactone ring may also be opened to be one carboxyl group and one hydroxyl group after reacting with $OH^-$ group. In some embodiment, the non-ALG moiety 320 may compose of polar group only, which does not change its structure after treated with etch development agent. For example, the non-ALG monomer moiety may compose of cyclic ketone or ester structure that attached to an acrylic and methacrylic polymer. In extreme ultraviolet lithography (EUV) or E-beam polymer, the non-ALG moiety may further compose of HS (hydroxylstyrene) or lactone structure.

Figure 3:
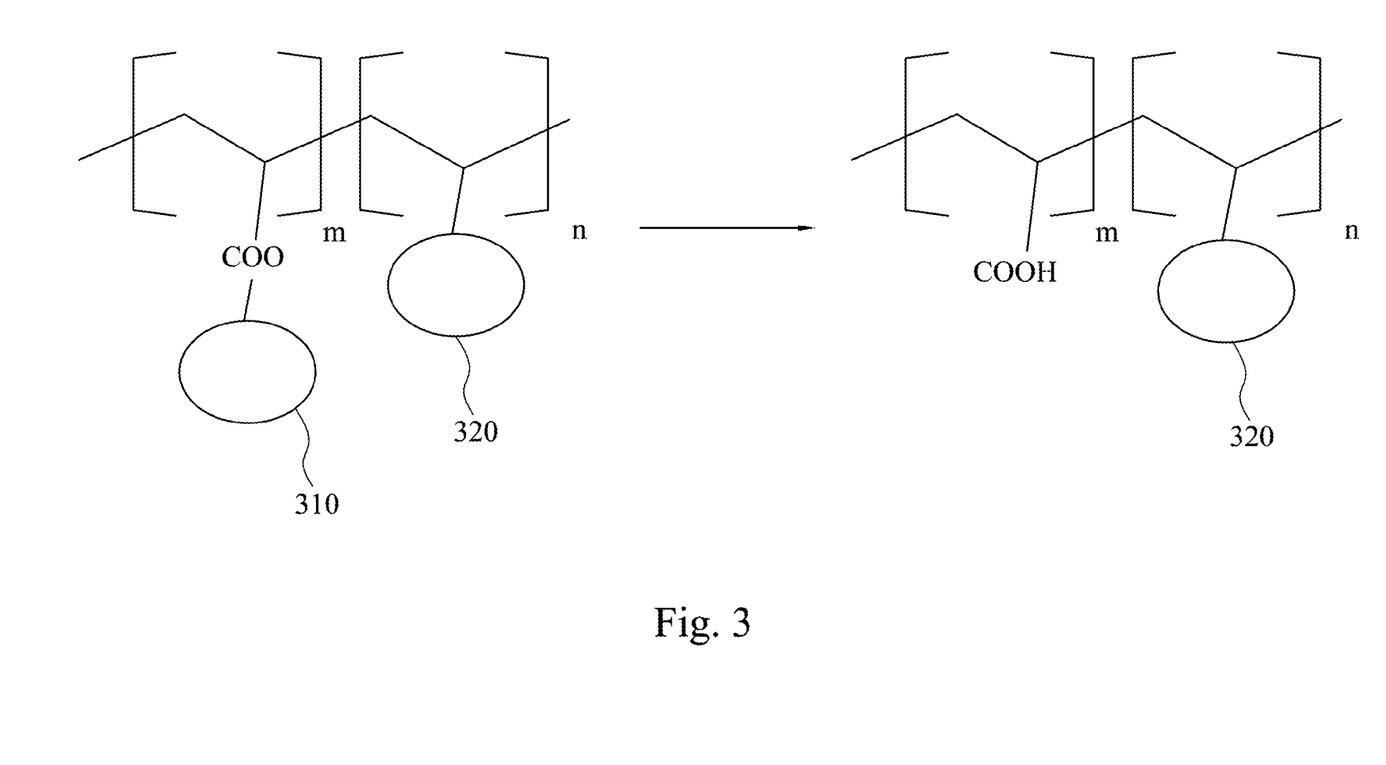
FIG. 3 is a schematic diagram showing the mechanism of acid liable group departure.

As shown in FIG. 3, after the ALG 310 leaves the polymer, the remaining carboxyl group on the polymer becomes polar that makes the polymer easily dissolve in base developer solution. In conventional approach, the ALG monomer 310 ratio in the polymer may ranges from 25 to 50% depending on the formulation. The remaining part of the polymer would be non-ALG monomer 320. For example, if the ALG monomer 310 occupies 40%, the non-ALG monomer 320 will be 60%. Normally, the higher the ALG ratio, the higher the photoresist contrast it may achieve. The ALG monomer 310 may be one single type of structure or compose of different types of ALG monomers into the polymer main chain. The polymer constituting the photoresist layer has 100% non-leaving ALG group before exposure. After exposure and baking, the photo acid generator (PAG) in the phtoresist layer is stimulated by exposure energy and releases one acid $H^+$ atom. The acid will initiate chemical amplify reaction (CAR) during post exposure baking (PEB) process. The acid will cause ALG group to leave, and carboxylic acid remains in the acrylate or methacrylate backbone of the polymer. The leaving ALG will be released into the air during baking or rinsed away during developing process. When acid concentration is high, the amount of leaving ALG will increase, and more carboxylic acid remains. As a result, the resulting polymer will be more soluble to base solution. In positive development, the exposed area has the strongest optical intensity and acid intensity. Most departure of ALG occurs at this site of the polymer. For example, more than 90% of ALG is lost. However, due to optical interference in sub-resolution small pitch pattern or half tone phase shift mask (HTPSM), the non-exposed area has partial exposure dosage that produces some acid and induces some ALG departure. The transition area between exposed and non-exposed interface 123, 143 also has partial exposed dosage that produces some acid and induces some ALG leaving. For example, more than 60% of ALG is removed. This leaving ALG/non-leaving ALG ratio has an effect on polymer solubility during development process, the higher the ALG leaving, the higher the dissolution rate to base developer. And the departure of ALG moiety induces film loss and rounded profile after development. If there is less than 50% of ALG leaves the polymer, this makes the polymer have lower affinity to developer but does not overcome the threshold where the polymer dissolves in developer. After development process, polymer shows some swelling effect that makes the pattern have surface roughness. If the optical intensity is close to zero, all the ALG groups are retained. For example, if less than 20% of ALG is removed from the polymer, the polymer is not soluble to base solution.

SUMMARY

The instant disclosure provides an etching development agent being less aggressive to the photoresist layer. According to some embodiment of the instant disclosure, the positive tone photoresist etching development agent for a photoresist film includes 0.5 to 2% by weight of tetramethylammonium hydroxide (TMAH), 1 to 20% by weight of an additive having at least two polar functional groups and at least one solvent. The photoresist film is EUV or E-beam resist, has a film thickness less than 100 nm and contains polarity switch groups. The additive has a molecular weight higher than 40, the solvent is water or alcohol, and the agent treated photoresist film has less film loss in partial exposure area than 2.38% TMAH agent. The solvent may be water or alcohol. The alcohol may be ethanol, propanol, or isopropanol. In another embodiment of the instant disclosure, the etching development agent includes 50 to 99.9% by weight of organic solvent; the solvent contain at least one of NBA, IAA, methyl 2-methyl pentanoate, methyl 3-methyl pentanoate, ethyl 2 methyl butanoate, pentyl acetate, isobutyl propionate, sec-butyl propionate or the mixture thereof. And 0.1 to 50% by weight of at least one additive. The additive contain polar bond that has affinity to exposed polymer. The etching development agent of the instant disclosure results in less damage to supposedly protected area and reduces the occurrence of rounded profile in the substrate.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Reference will now be made in detail to the present embodiments of the invention, examples of which are illustrated in the accompanying drawings. Wherever possible, the same reference numbers are used in the drawings and the description to refer to the same or like parts.

In the instant disclosure, an etching development agent is employed to reduce the film loss in the pattern area. As shown in FIGS. 1 and 4, the undesirable substrate 121, 141 loss can be reduced, and the intended thickness of the substrate 421, 441 is retained after the development process. The etching development agent minimizes rounding effect than a conventional approach. The photoresist layer roughness, swelling and loss are greatly reduced because of the composition of the etching development agent. The etching developer has less swelling, water uptake, or TMAH ionic bonding to exposed carboxylic acid. If the photoresist polymer has less uptake of water or TMAH, the polymer intermolecular force become stronger that has less dissolution rate to developer. The intermolecular force is disrupted by the uptake of conventional high concentration TMAH solution. Therefore, the post development photoresist layer has higher young's module by using the etching development agent of the instant disclosure. The degree of etching pattern distortion during or after development process can be controlled.

After a photoresist layer is exposed and undergoes post exposure baking, the acid labile group (ALG) leaves from covalent bond with the polymer, while carboxylic acid group remains on the polymer. When encountering base developer, the ALG group is leached away. The polymer containing carboxylic acid group loses an acid, deprotonated, and become negatively charged carboxyl group. Thus, the polymer become charged, i.e., more polar, with increased solubility to water.

Figure 4A:
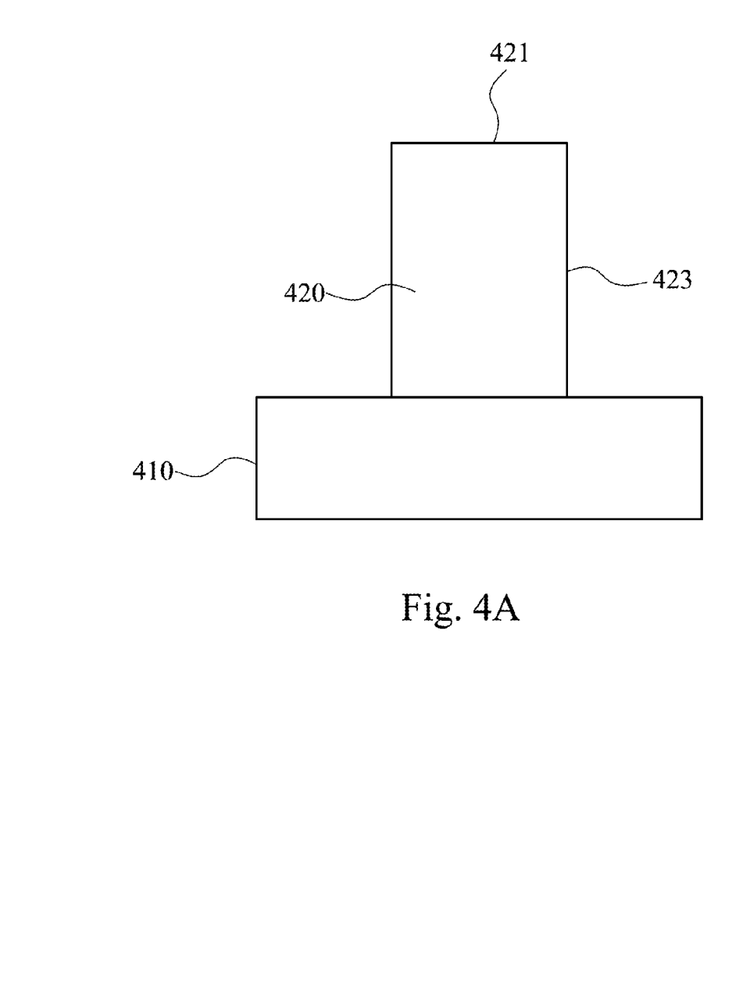
FIGS. 4A and 4B are schematic diagrams showing substrate retaining desirable profile after treated by an etching development agent in accordance with some embodiments of the instant disclosure.
Figure 4B:
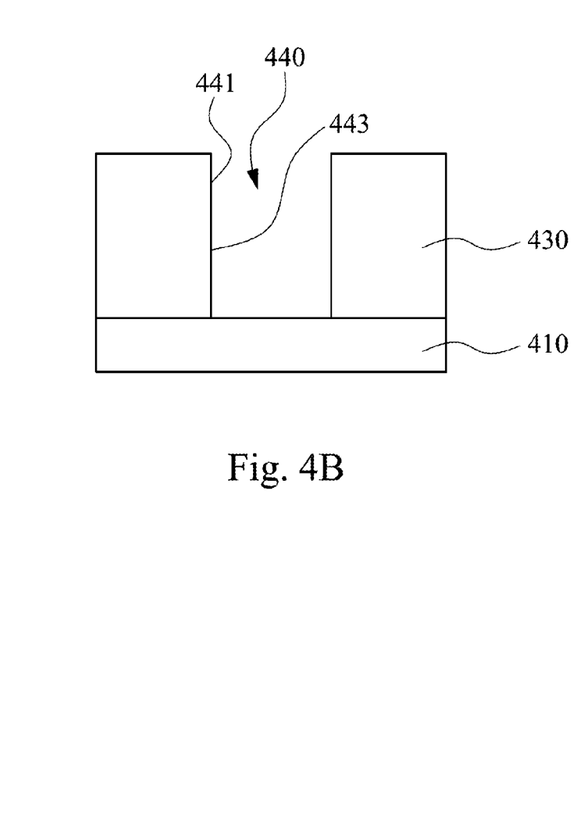
Figure 5:
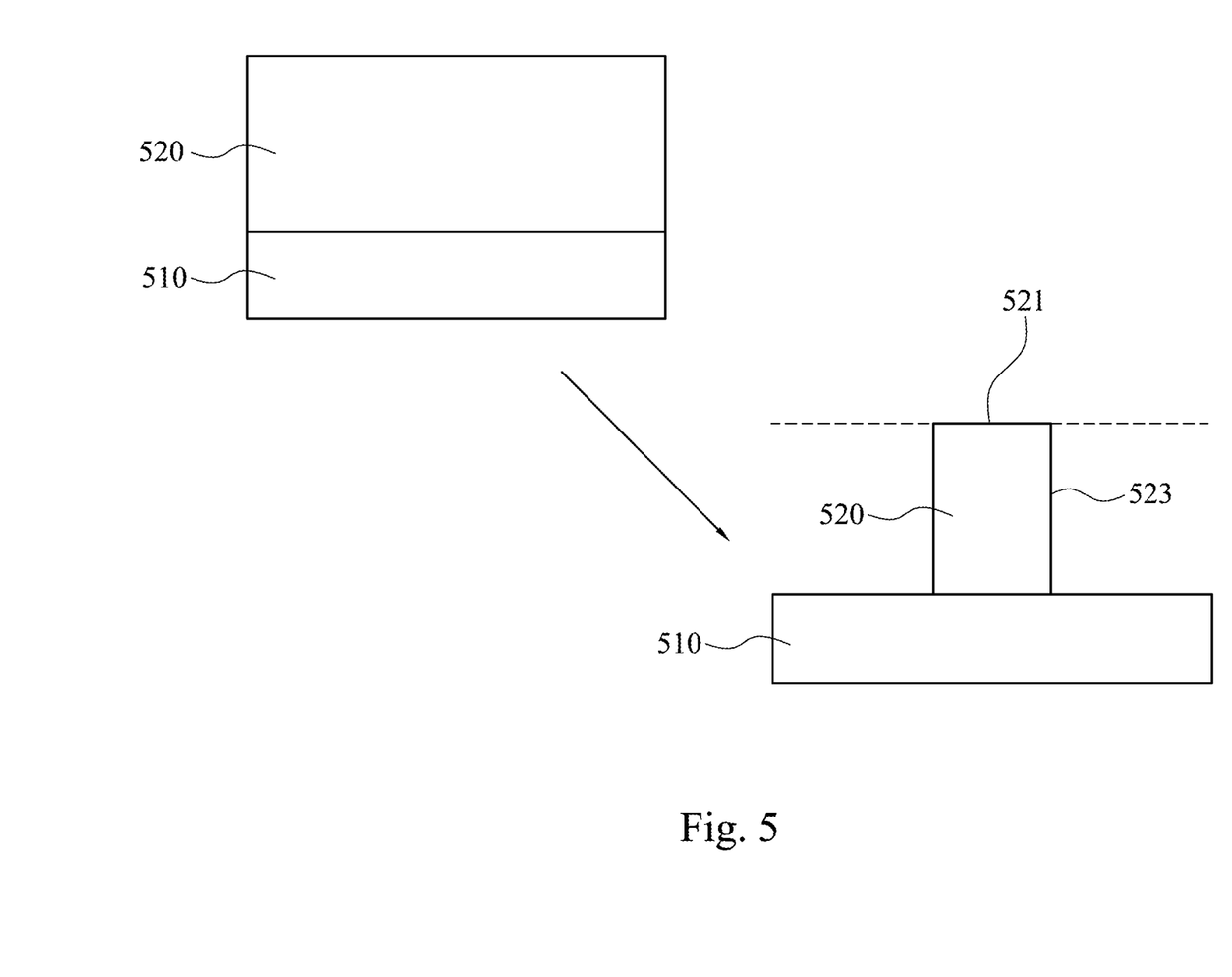
FIG. 5 is a schematic diagram showing a substrate treated by an etching development agent in accordance with some embodiments of the instant disclosure.

According to some embodiment of the instant disclosure, the etching development agent contains TMAH, diamine or additive, and water or alcohol as solvent. The diamine has base ability to deprotonated the polymer carboxyl acid to reduce the TMAH loading for TMAH swelling reduction. The additive may have two functional groups to have an ionic or hydrogen bonding ability to carboxyl group to form intermolecular hydrogen bond or ionic cross-linking bond. The intermolecular hydrogen bond or cross-link reduces the polymer solubility, even if the polymer has a large number of ALGs. In exposed area, more than 90% of the ALG are separated from the polymer backbone. Please refer to FIGS. 4A, 4B and 5. The bottom substrate 410 remains intact, and the photoresist layer retains its integrity after etch development agent treatment such that the upper substrate 420 have sharp corners and smooth surface 421, 423. The same applies to the substrate 430 in FIG. 4B, where a trench or hole 440 is formed with sharp edge 443 and corner 441. As shown in FIG. 5, the exposed area is etched away after the photoresist layer is treated by the etching development agent, while the protected area 520 retains its desirable profile with minimum of damage. As shown in FIGS. 4A and 5, the protected area 520 does not show signs of rounded corners or worse film loss effect. The desirable thickness of the protected area 520, which is shown by a dash line 521 in FIG. 5, is intact.

Figure 6:
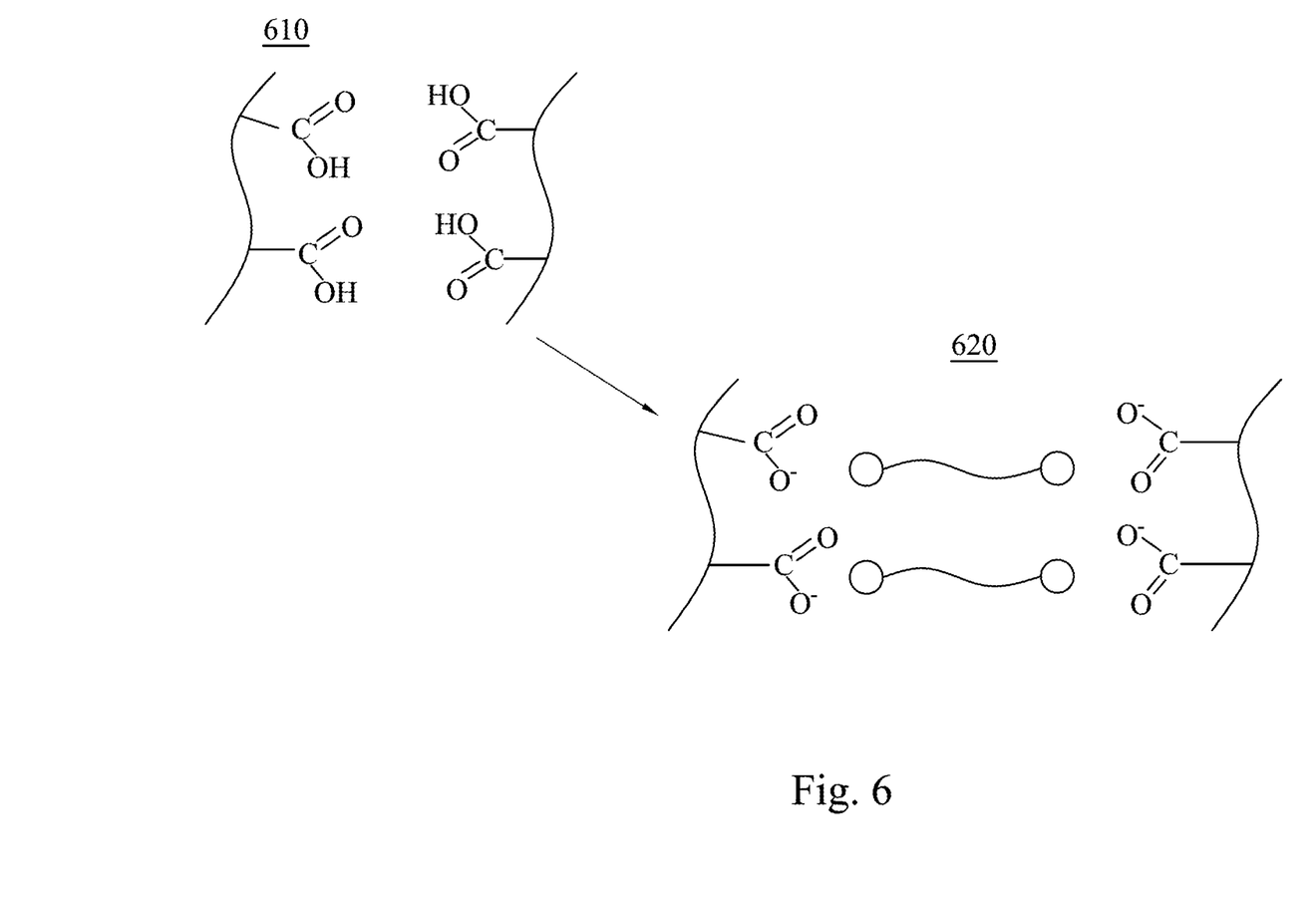
FIG. 6 is a schematic diagram showing carboxyl group dissociating after treatment with an etching development agent in accordance with some embodiments of the instant disclosure.

Please refer to FIG. 6. In the presence of the etching development agent, a portion of free carboxyl group will be engaged to form cross-linking polymer with another polymer. By controlling the type and proportion of additive, the cross-linking reaction can be controlled without failing the development process or polymer re-deposition. For example, if less than 20% of the free carboxyl group is cross-linked in fully exposed photoresist area, the remaining 80% of carboxyl group still has good solubility for pattern developing. After photoresist is exposed, about 20% to 70% of ALG might react with PAG and leave from polymer in the line pattern surface area 121 or pattern corner area 141. In conventional 2.38% TMAH developer material, the departure of 20% to 70% ALG will enhance the polymer solubility and induce film loss at undesired area for surface film lose and corner rounding 121, 141. When using the etching development agent of the instant disclosure, the polymer in surface and corner area 121, 141 will has about 20% carboxyl group is cross-linked, and about 0% to 50% carboxylic group is free to dissolve in water.

In one embodiment, the etching development agent contain TMAH and non-ionic amine, the TMAH is less than 2.38%. For example, the TMAH is about 1% to 2%. In one embodiment, the TMAH is about 1.2 to 1.8%. The non-ionic amine can be alkyl amine, bi-alkyl amine, tri-alkyl almine, diamine, triamine. In one embodiment, the amine is ethylene diamine, and the loading is about 0.5% to 30%. The solvent can be water or alcohol. In one embodiment, the solvent is water. Since the ionic TMAH can ionic bond to carboxyl group and makes the polymer swelling for solubility enhancement. By replacing part of the TMAH loading with amine, the ionic swelling effect can be reduced. Moreover, the non-ionic amine can help compensate the base lose from reducing the TMAH loading. The total etching development time and photoresist exposure energy are thus similar to conventional approach. By using this new etching development agent, even the polymer has a departure rate of 20% to 70% ALG, the polymer swelling and solubility is reduced. According to the embodiment, the dissociating rate is thus reduced. The polymer can maintain its integrity because of lower polymer dissolution rate in partial exposure area 421, 441, and at the same time exposure area 440 is etched away.

In the case of swelling effect, a polymer has less solubility with less carboxyl group bonding to TMAH, and about 1% to 20% carboxyl group is cross-linked with cross linking additive. Moreover, the TMAH loading is replaced with amine that also reduces the solubility and swelling of carboxyl group bonding to TMAH. In the presence of the etching development agent, the number of soluble carboxyl group is reduced such that the photoresist layer surface is more hydrophobic. The patterned photoresist layer is less likely to collapse or bend because of less swelling during the developing process. Moreover, the cross-linking resulting from the treatment with the etching development agent increases the substrate rigidity that prevents the pattern from surface roughness, melting, bending, and collapsing.

The additive in the etching development agent has polarity group that can interact with the carboxyl group. A concentration of the additive ranges between 1 to 50% by weight in the etching development agent. The polarity group can be nitrogen atom or oxygen containing group. The additive contains at least two polarity groups that are able to connect adjacent polymers to allow cross-linking through the additive. If the cross-linking reaction is ionic, the additive contains positively charged functional group. For example, it can be quaternary amine. It can be $N^+R4$, where R being an alkyl group or an aryl group. Unlike the ammonium ion ($NH_4^+$) and the primary, secondary, or tertiary amide, the quaternary amide has permanently stronger charged than the other, independent of the pH in the solution. The additive can be tetra-ethyl ethylene diamine or hexa-ethyl ethylene diamine. The ionic bonding between the polymers assisted by quaternary amine is strong. In the etching development process, the etching development agent is a base aqueous solution. As shown in FIG. 6, when the substrate is treated by the etching development agent, hydrogen dissociates, and carboxyl functional group ($COO^-$) remains. The negative charged $COO^-$ is easily attacked by positively charged functional group. The negative charged $COO^-$ is also easily attacked and attached by H-bond through the amine functional group. Other cyclic amine, secondary amine, tertiary amine or positively charged amine can also be used for this purpose.

In some embodiments of the instant disclosure, one of the polar groups contains OH functional group, and the other polar group is quaternary amine. The two-polar additive may be, for example, $[(CH_3)_3NCH_2CH_2OH]Cl$, $[(CH_3)_3NCH_2CH_2OH]I$, $[(CH_3)_3NCH_2CH_2OH]Br$, $[(CH_3)_3NCH_2CH_2OH]CO_3$, or $[(CH_3)_3NCH_2CH_2OH]OH$.

The additive may contain more than two polar functional groups, for example, trimethylolglycoluril, tetramethylolglycoluril, ethylenediaminetetraacetic acid (EDTA), glycine, gluconate and terephthalic acid.

The carboxyl functional group may also react through hydrogen bonding. Any molecule that includes OH or NH functional group has high affinity to carboxyl functional group, and the two functional groups may form hydrogen bond between the agent and the substrate. A general formula of this type of additive may be, for example, $R_1R_2NR_3NR_4R_5$, $HO—R_3—NR_1R_2R_3$ or $HO—R_3—OH$. The $R_3$ group can be linear, branched, cyclic, alkyl, alkylene or alkyne. For example, the $R_3$ can be $—CH_2CH_2—$, $—C_6H_4$-(benzyl), $—CH_2CH_2CH_2—$ or the like. The $R_1$, $R_2$, $R_4$, $R_5$ can be H, $CH_3$, $C_2H_5$, or other branch alkyl group. For example, the branch alkyl group can be CH3CHCH3-, (CH3)3C-, or C2H5CHCH3-.

The additive may be, for example, ethylene diamine, tetra methyl ethylene diamine, tetra ethyl ethylene diamine, 1,3-Diaminopropane, N,N,N',N'-tetramethyl-1,3-propanediamine, N,N,N',N'-tetraethyl-1,3-propanediamine, ethylene glycol, propylene glycol. ethane-1,1,2-triol, propane-1,2,3triol, pentane-1,3,5-triol, propane-1,3-diamine, tetramethylolglycoluril (TMGU), or (1S,2S)-4-Cyclohexene-1,2-diamine.

The etching development agent is especially useful in extreme ultraviolet lithography (EUV) and electron-beam (E-beam) process because in the EUV and E-beam process, the photoresist is more hydrophilic than that in the ArF process. In the EUV and E-beam process, the photoresist polymer contains more HS (hydrostyrene) monomer for higher photoresist sensitivity. The HS monomer enhance polymer swells and dissolves in conventional etching agent. The high solubility of EUV polymer results in unwanted film loss of EUV photoresist layer and resist pattern sidewall surface roughness that is deleterious to process window. The etching development agent of the instant disclosure greatly reduces the film loss of the photoresist layer.

Table 1 shows the results where the standard substrate thickness after photoresist layer coating is normalized as 1. The thickness of the photoresist layer after treated by etching development agent treatment is normalized against the standard one. For one embodiment, the initial coating thickness of EUV resist film is 75 nm. After exposure by half-tone phase shift mask (HT-PSM), the unexposure area has partially exposed from HT-PSM. After developing the thickness will be less than 65 nm depending on resist polymer design. Typically, the final film thickness is about 55 nm to 60 nm by conventional etching development agent. If using the development agent of the instant disclosure, the photoresist layer retains a thickness more than 60 nm.

TABLE 1

|  | Normalized thickness |
| --- | --- |
| After photomask coating | 1.0 |
| 2.38% TMAH | 0.7 |
| 1.5% TMAH | 0.8 |
| 1.5% TMAH + TMGU | 0.9 |
| 2.38% TMAH + TMGU | 0.8 |
| 2.38% TMAH + ethylene diamine | 0.8 |
| 1.5% TMAH + ethylene diamine | 0.9 |
| 1.5% TMAH + ethylene diamine + surfactant | 0.9 |
| 2.38% TMAH + tetraethyl ethylene diamine | 0.8 |
| 2.38% TMAH + ethylene glycol | 0.8 |
| 1.5% TMAH + ethylene glycol | 0.9 |
| 1.5% TMAH + ethylene glycol + surfactant | 0.9 |
| 1.5% TMAH + ethylene glycol | 0.9 |
| 1.5% TMAH + ethane-1,1,2-triol | 0.9 |
| 1.5% TMAH + propane-1,2,3-triol | 0.9 |
| 1.5% TMAH + pentane-1,3,5-triol | 0.9 |
| 1.5% TMAH + propane-1,3-diamine | 0.9 |
| 1.5% TMAH + (1S,2S)-4-Cyclohexene-1,2-diamine | 0.9 |

In addition to additive in the etching development agent, the concentration of TMAH also has effect on the photoresist layer loss or swelling. In some embodiments of the instant disclosure, the concentration of TMAH is reduced to a range between 0.5 to 2.38% by weight as shown in Table 1. When the TMAH concentration falls between 0.5 to 2.38% by weight, the polymer solubility is reduced. When TMAH concentration reduces from 2.38% to 1.5%, undesired photoresist layer loss is reduced by about 5% to 10%. Alternatively, bulky tetra-butyl-ammonium hydroxide (TBAH) may be used to replace TMAH in the etching development agent. TBAH has stereo effect, and an etching development agent containing TBAH shows similar property as TMAH. If the TBAH concentration is less than 2.38%, the polymer loss is minimized.

The solubility of the substrate can be reduced by adding a terminal capping additive in the etching development agent. The polarity of the carboxyl functional groups can then be blocked. The capping additive may be, for example, dihydroxyphenol or ortho-hydroxyphenol.

The additive in the etching development agent includes surfactant. A surfactant reduces surface tension of the photoresist layer. It can improve the wetting during development and minimizes air bubble formation. The surfactant may be ionic or non-ionic, for example, alkyl, fluoroalkyl or siloxane surfactant. The surfactant additive has a concentration in the etching development agent ranging from 0.001% to 0.6%. In the presence of a surfactant additive, the surface tension of the photoresist layer reduces to lower than 72 dyne/cm. The surfactant facilitates cross-linking additive entering the photoresist layer to prevent unwanted substrate dissociation. The surfactant is obtained from commercially available products like Air Product surfynol 104, 420, 440, 465, 485. Other surfactant includes Dynol 360, Dynol 604, Dynol 607, Dynol 800, Dynol 810, Dynol 960 and Dynol 980 provided by Air Product, ECOSURF LF20, ECOSURF LF30 and ECOSURF LF45 provided by Dow Chemical, MEGAFACE F-554, MEGAFACE F-556 and MEGAFACE R-43 provided by DIC, FS-8000, FS-8050, FS-8020DB, FS-8020EB, FS-8100, FS-8150, FS-8200, FS-8250 and FS-8388 provided by Thetawet. In some embodiments of the instant disclosure, the surfactant is obtained from 3M® Novec 4200, FC-4430, FC-4434, FC-5120 In still another embodiment of the instant disclosure, the surfactant is obtained from Daikin DSN-403N, Polyfox PF151n, PF156 or Dupont® capstone or zonyl series.

TABLE 2

|  | Normalize thickness |
| --- | --- |
| After photomask coating | 1.0 |
| NBA | 0.7 |
| NBA + ethylene diamine | 0.8 |
| NBA + tetra-methyl ethylenediamine | 0.8 |
| IAA + tetra-methyl ethylenediamine | 0.8 |

Table 2 shows the performance in negative tone development (NTD) etching development agent. In NTD development, the exposed area with carboxyl functional group is more hydrophilic that become insoluble to non-polar hydrophobic NTD solvent, for example, n-butyl-acetate(NBA) or iso-amyl-acetate(IAA) solvent. The non-exposure area with ALG is more hydrophobic that will be etching away by the NTD solvent. The final after developer pattern is exposed pattern, which is negative tone to conventional positive tone TMAH development (PTD) process. The photoresist layer contains HS monomer as non-ALG unit, which increases the solubility to any etching development agent. NBA solvent has solubility to HS polymer. This means photoresist layer loss in the development process. Therefore, adding a cross linker to the NTD solvent can reduce the photoresist layer loss as shown in Table 2. The moiety becomes carboxylic acid after the departure of ALG group. The carboxylic acid group (COOH) in NTD allows broader selection of the additive for cross linking. For example, the additive may have polar group including OH, NR and COOH.

In one embodiment, the etching development agent contains 70% to 99% organic solvent and 1% to 30% additive. The organic solvent can be NBA, IAA, PGMEA, PGME, Pentyl acetate, isobutyl propionate, sec-butyl propionate, isopropyl isobutyrate, ethyl pivalate, 5-Methyoxy 3-Hexanone, methyl-2methyl pentanoate, ethyl 2-methyl butanoate or the combination thereof. The additive has at least two polar functional group to form H-bond or polar bond to the exposed photoresist polymer. The additive and be amine. The amine can be alkyl amine, bi-alkyl amine, tri-alkyl almine, diamine, triamine. In best embodiment, the amine is tetra methyl ethylene diamine, the loading is about 0.5% to 30%. In another embodiment, the additive may be, for example, ethylene diamine, tetra ethyl ethylene diamine, 1,3-Diaminopropane, N,N,N',N'-tetramethyl-1,3-propanediamine, N,N,N',N'-tetraethyl-1,3-propanediamine, ethylene glycol, propylene glycol. ethane-1,1,2-triol, propane-1,2, 3triol, pentane-1,3,5-triol, propane-1,3-diamine, tetramethylolglycoluril (TMGU), or (1S,2S)-4-Cyclohexene-1,2-diamine.

The PTD or NTD etching development agent can use additive containing carboxylic acid (COOH), for example, EDTA, or cis-butenedioic acid and trans-butenedioic acid. Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A negative tone photoresist etching development agent comprising an organic solvent, wherein the organic solvent is isobutyl propionate.

* * * * *